United States Patent [19]

Hiiro

[11] Patent Number: 5,048,030
[45] Date of Patent: Sep. 10, 1991

[54] LIGHT AMPLIFYING DEVICE

[75] Inventor: Hiroyuki Hiiro, Kanagawa, Japan

[73] Assignee: Fuji Photo Film Co., Ltd., Kanagawa, Japan

[21] Appl. No.: 668,332

[22] Filed: Mar. 14, 1991

Related U.S. Application Data

[63] Continuation of Ser. No. 458,254, Dec. 28, 1989, abandoned.

[30] Foreign Application Priority Data

Dec. 28, 1988 [JP] Japan .................................. 63-333125

[51] Int. Cl.$^5$ ............................................. H01S 3/14
[52] U.S. Cl. ...................................... 372/68; 372/97; 372/106; 372/100; 359/347; 359/349; 359/495
[58] Field of Search .................. 350/400, 401, 402; 372/68, 97, 98, 99, 100, 105, 106, 93, 108, 27

[56] References Cited

U.S. PATENT DOCUMENTS

| | | | |
|---|---|---|---|
| 3,407,364 | 11/1968 | Turner | 372/93 |
| 3,414,840 | 12/1968 | Di Domenico, Jr. et al. | 372/68 |
| 3,576,502 | 4/1971 | Johnston, Jr. et al. | 372/98 |
| 3,736,526 | 5/1973 | Simmons | 372/97 |
| 4,199,226 | 4/1980 | Weber et al. | 350/401 |

FOREIGN PATENT DOCUMENTS

| | | | |
|---|---|---|---|
| 55-67722 | 5/1980 | Japan . | |
| 0216110 | 12/1984 | Japan | 350/401 |
| 0140508 | 5/1985 | Japan | 350/401 |

OTHER PUBLICATIONS

Hecht and Zajac, *Optics*, Addison-Wesley, Reading MA, Sections 8.4.3, 8.7.1 and 8.11.2, 1979.

*Primary Examiner*—Frank Gonzalez
*Assistant Examiner*—Susan S. Morse
*Attorney, Agent, or Firm*—Sughrue, Mion, Zinn Macpeak & Seas

[57] ABSTRACT

A light amplifying device comprising an optical oscillator constituted by first and second reflective mirrors and a common reflective mirror disposed in an optically opposite relation to each other, a polarized beam splitter for making a laser beam incoming from the side of the common reflective mirror incident on the first or second reflective mirror, and for making laser beams incoming from the sides of the first and second reflective mirrors incident on the common mirror, first and second amplifying media disposed in optical paths of the respective laser beams for amplifying the laser beams, and an optical element for rotating the polarizing plane of the laser beam reflected by the common reflective mirror by a predetermined angle. The laser beams emitted from the first and second amplyfying media are repeatedly between the first and second reflective mirrors and the common reflective mirror while being amplified through the respective amplifying media, for being emitted from the common reflective mirror as a high-energy synthesized laser beam in a single polarized state.

19 Claims, 5 Drawing Sheets

LIGHT AMPLIFYING DEVICE

This is a continuation of application Ser. No. 07/458,254 filed Dec. 28, 1989 now abandoned.

BACKGROUND OF THE INVENTION

1. Field of the Invention

The present invention relates to a light amplifying device, and more particularly to a light amplifying device capable of emitting a light of high energy and hence suitable as a light source for an optical recording device to record information such as characters on a recording medium.

2. Description of the Related Art

Among devices for recording information such as characters on a recording material by the use of a light beam, there is a known laser computer output microfilmer (laser COM), for example, in which a laser beam is scanned in accordance with information output from a computer to directly record the information in the form of characters or the like on a recording material such as a microfilm (see Japanese Patent Laid-Open No. 55(1980)-6772). The laser COM comprises an argon laser for emitting a laser beam, an optical modulator for optically modulating the laser beam in accordance with the information such as characters, a rotatable multifaceted or polygonal mirror for deflecting the laser beam modulated by the optical modulator in a main scan direction, and a galvanometer provided with a deflecting mirror to deflect the reflected light from the rotatable polygonal mirror in a sub-scan direction. With the combination of the rotatable polygonal mirror and the galvanometer, the laser beam output from the optical modulator is two-dimensionally scanned on the recording material through a scan lens, so that the information such as characters is recorded on the recording material.

The above laser COM requires an optical modulator because the former employs an argon laser which cannot be subjected to on/off control. For the reason, it has recently been proposed to use a semiconductor laser in place of the argon laser. However, the power of semiconductor lasers is small in a range from several mW to several tens of mW at most when continuously oscillated. Therefore, semiconductor lasers have difficulties in application thereof to those recording materials which require a laser beam of high energy, e.g., heat mode recording materials such as LDF (laser direct recording films). In addition, OPTICS LETTERS/Vol. 11, No. 5/May 1986, discloses such a technique that laser beams emitted from a plurality of lasers are summed or superimposed coherently by a diffraction grating so as to produce a laser beam in a single polarized state.

The above technique however has several problems as follows. Use of the diffraction grating for summing the plural laser beams makes it difficult to design the grooved surface configuration of the grating necessary for directing all the diffracted laser beams toward a certain direction. Another problem is in that efficiency of the optical system is low because of the need of taking out only the O-order diffraction light through an aperture, while shielding other laser beams diffracted in nonessential directions. Further, a polarized beam splitter is employed to sum the laser beams emitted from two semiconductor lasers. But, the laser beam having been summed contains both a P-polarized light oscillating parallel to the incident plane of the polarized beam splitter and an S-polarized light oscillating perpendicular to that incident plane. Accordingly, if a polarizer is disposed in an optical path lying after summarization into the single beam, $\frac{1}{2}$ of the light intensity could not pass through the polarizer.

SUMMARY OF THE INVENTION

It is an object of the present invention to solve the problems as mentioned above, and provide a light amplifying device of simple construction which can efficiently output a laser beam of high energy.

To achieve the above object, a light amplifying device of the present invention comprises an optical oscillator constituted by first and second reflective mirrors and a common reflective mirror disposed in optically opposite relation to each other, the common reflective mirror having reflectivity smaller than reflections of the first and second reflective mirrors; optical path changing means disposed between the first and second reflective mirrors and the common mirror for making a laser beam incoming from the side of the common reflective mirror emerge in a direction toward at least one of the first and second reflective mirrors corresponding to either direction of the orthogonal polarizing planes, and for making laser beams incoming from the sides of the first and second reflective mirrors incident on the common mirror; first and second amplifying media disposed in optical paths of the laser beams between the first and second reflective mirrors and the optical path changing means, respectively, for amplifying the laser beams through the process of stimulated emission; and an optical element disposed between the common reflective mirror and the optical path changing means to be able to pass the laser beams therethrough for rotating the polarizing plane of the laser beam reflected by the common reflective mirror by a predetermined angle with respect to the polarizing plane of the laser beam outcoming from the optical path changing means.

In accordance with the present invention, the optical path changing means is disposed between the first and second reflective mirrors and the common reflective mirror which are disposed in optically opposite relation to each other for jointly constituting the optical oscillator. The optical path changing means makes a laser beam incoming from the side of the common reflective mirror emerge in a direction toward at least one of the first and second reflective mirrors corresponding to either direction of the orthogonal polarizing planes, and also makes laser beams incoming from the sides of the first and second reflective mirrors incident on the common mirror. Since the first and second amplifying media are disposed in optical paths of the laser beams between the optical path changing means and the first and second reflective mirrors, respectively, the laser beams outcoming from the optical path changing means are amplified through the respective amplifying media and then reflected by the first and second reflective mirrors. Afterward, the reflected laser beams are amplified again while passing therethrough, followed by impinging upon the common reflective mirror via the optical path changing means. The optical element is disposed between the common reflective mirror and the optical path changing means for rotating the polarizing plane of the laser beam reflected by the common reflective mirror by a predetermined angle with respect to the polarizing plane of the laser beam outcoming from the optical path changing means. The laser beam passing the optical element to enter the optical path changing means again is changed in its optical path to emerge in the direction toward at least one of the first and second reflective mirrors in accordance with the polarizing plane of that laser beam rotated by the optical element, for being then incident on the respective amplifying media.

Assuming now that the polarized lights with their polarizing planes orthogonal to each other are given by a P-polarized light and an S-polarized light, the optical element functions to convert a portion or the whole of the P-polarized light to the S-polarized light and a portion or the whole of the S-polarized light to the P-polarized light during the repeated reflection cycles of the polarized laser beams. Therefore, one optical oscillator comprising the first reflective mirror, the common reflective mirror and the amplifying medium disposed therebetween, and another optical oscillator comprising the second reflective mirror, the common reflective mirror and the amplifying medium disposed therebetween jointly constitute a single united oscillator so that the P-polarized light and the S-polarized light are coherently summed together. Thus, the P-polarized light and the S-polarized light are unified into a high-energy laser beam in a single polarized state. If, a phase difference is present between the laser beams to be summed, the resultant laser beam usually becomes an elliptically polarized light. In this case, the phase difference is compensated by a wavelength plate or the like to provide the summed laser beam in a single linearly polarized state.

Further, in each of the aforementioned amplifying media a semiconductor element having an active layer held between a pair of clad layers can be used. Such a semiconductor element emits a laser beam which has its major axis lying in a direction perpendicular to the active layer and also has an oval circular sectional shape. Therefore, the semiconductor elements are disposed in the optical paths of the laser beams between the first and second reflective mirrors and the optical path changing means, respectively, such that the oval circles of the laser beams are entirely superimposed onto each other. For ensuring the arrangement that the oval circles of the laser beams are entirely superimposed onto each other, it is simply needed to arrange the semiconductor elements in such a manner as to direct their active layers to hold the same angle with respect to a reference plane. For example, assuming that the reference plane is a horizontal plane, the semiconductor elements are arranged such that the active layers lie on the horizontal plane (i.e., the active layers hold an angle of 0 degrees with respect to the reference plane). In this case, the laser beams emitted from the respective semiconductor elements have their major axes in section lying vertically. Where the semiconductor elements are arranged in such orientation, the polarizing planes of the laser beams emitted from the respective semiconductor elements are also directed corresponding to that orientation. Accordingly, the polarizing plane of at least one of the laser beams is rotated to adjust the laser beams having their predetermined polarizing planes are incident on the optical path changing means.

In a like manner as mentioned above, the laser beams emitted from the semiconductor elements are repeatedly reflected between the corresponding reflective mirrors and the common reflective mirror while being amplified through the semiconductor elements. As a consequence, the resultant laser beam is emitted from the common reflective mirror as a high-energy laser beam summed in a single polarized state.

As described above, the present invention can offer the following advantageous effects. Since lights emitted from the plural amplifying media are oscillated and summed coherently using the optical path changing means which utilizes the property of polarization, it is possible to provide a high-energy light in a single polarized stage with the simple construction.

Further, by employing semiconductor elements as the amplifying media and then arranging those semiconductor elements such that their laser beams are superposed onto each other entirely in section, it is possible to provide a laser beam resulted from evenly summing the laser beams emitted from the respective semiconductor elements.

DETAILED DESCRIPTION OF PREFERRED EMBODIMENTS

Figure 1:
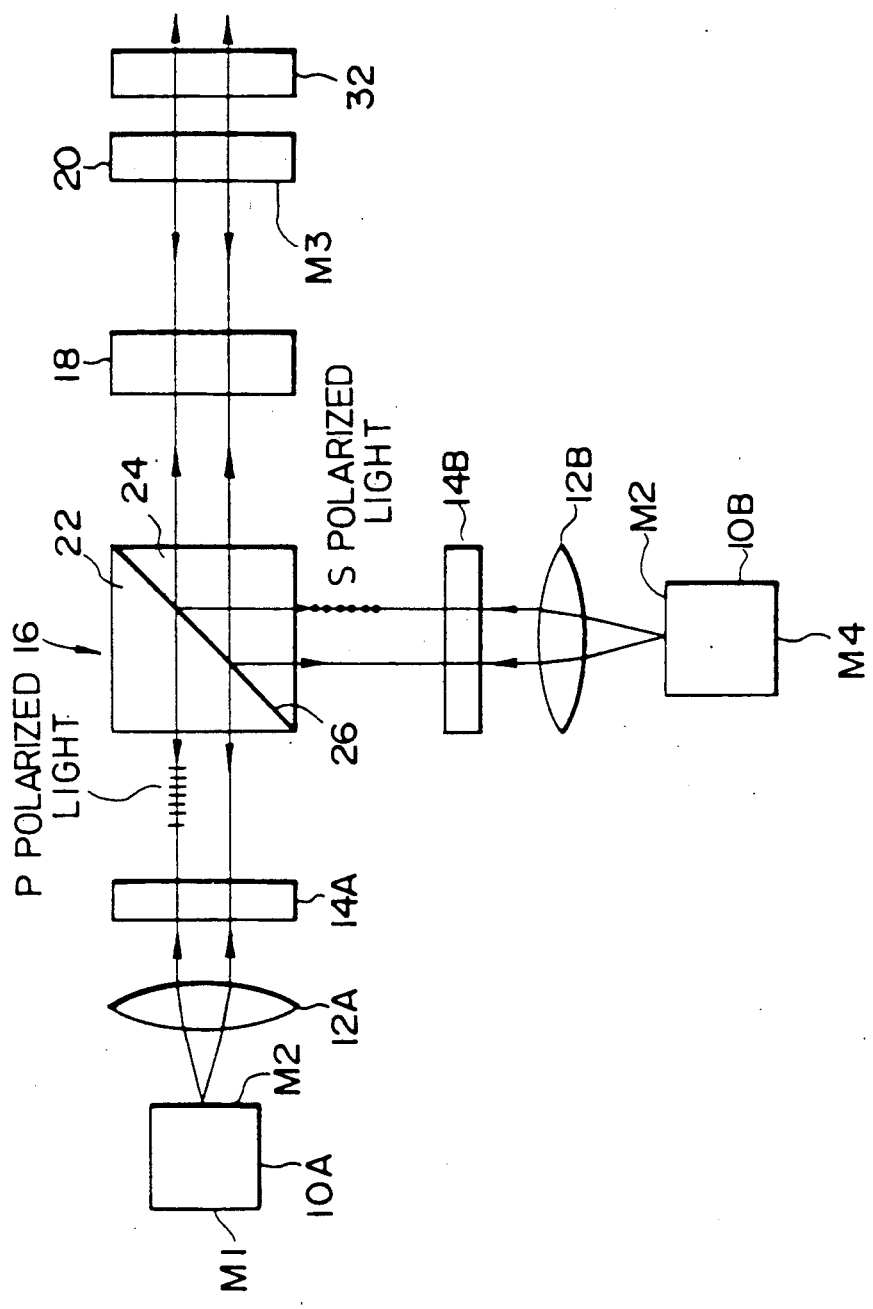
FIG. 1 is a diagrammatic plan view of a practical embodiment of the present invention.

Hereinafter, the present invention will be described in connection with embodiments arranged to achieve the above object by using a polarized beam splitter as an optical path changing means.

According to a first embodiment, a light amplifying device comprises a polarized beam splitter allowing a P-polarized light oscillating in parallel to the incident plane to pass through the polarized beam splitter, and reflecting an S-polarized light oscillating perpendicular to the incident plane in a direction different from the passing direction of the P-polarized light; an optical oscillator constituted by a first reflective mirror and a common reflective mirror having reflectivity smaller than that of the first reflective mirror, both of which mirrors are disposed in an optical path extended in the passing direction of the P-polarized light in opposite relation to each other with the polarized beam splitter therebetween; a second reflective mirror having reflectivity equivalent to that of the first reflective mirror, and disposed in an optical path extended in the reflecting direction of the S-polarized light such that the polarized beam splitter is interposed between the common reflective mirror and the second reflective mirror, thereby constituting another optical oscillator in cooperation with the common reflective mirror; amplifying media disposed between the first reflective mirror and the polarized beam splitter and the second reflective mirror and the polarized beam splitter, respectively, for amplifying the lights through the process of stimulated emission; and an optical element disposed between the common reflective mirror and the polarized beam splitter to be able to pass the lights therethrough for rotating the polarizing plane of the light reflected by the common reflective mirror by a predetermined angle with respect to the polarizing plane of the light outcoming from the polarized beam splitter.

According to a second embodiment, a light amplifying device comprises a polarized beam splitter allowing a P-polarized light oscillating in parallel to the incident plane to pass through the polarized beam splitter, and reflecting an S-polarized light oscillating perpendicular to the incident plane in a direction different from the passing direction of the P-polarized light; an optical oscillator constituted by a first reflective mirror and a common reflective mirror having reflectivity smaller than that of the first reflective mirror, both of which are disposed in an optical path extended in the passing direction of the P-polarized light in opposite relation to each other with the polarized beam splitter therebetween; a second reflective mirror having reflectivity equivalent to that of the first reflective mirror, and disposed in an optical path extended in the reflecting direction of the S-polarized light such that the polarized beam splitter is interposed between the common reflective mirror and the second reflective mirror, thereby to constituting another optical oscillator; semiconductor elements each having an active layer held between a pair of clad layers to emit a laser beam which has the major axis directed perpendicular to the active layer and has an oval circular sectional shape, the semiconductor elements being disposed between the first reflective mirror and the polarized beam splitter and between the second reflective mirror and the polarized beam splitter, respectively, such that the oval circles of the laser beams are entirely superposed onto each other; polarizing plane adjuster means for rotating the polarizing plane of at least one of the laser beams emitted from the semiconductor elements to be adjusted such that the laser beams enter the polarized beam splitter as P- and S-polarized lights; and an optical element disposed between the common reflective mirror and the polarized beam splitter to be able to pass light therethrough for rotating the polarizing plane of the light reflected by the common reflective mirror by a predetermined angle with respect to the polarizing plane of the light outcoming from the polarized beam splitter.

With the first embodiment, the first reflective mirror and the common reflective mirror constituting the optical oscillator are disposed in an optical path extended in the passing direction of the P-polarized light through the polarized beam splitter in opposite relation to each other with the polarized beam splitter therebetween. Accordingly, when the light emitted from the amplifying medium disposed between the first reflective mirror and the polarized beam splitter is made incident on the polarized beam splitter as a P-polarized light, this P-polarized light passes through the polarized beam splitter and then the optical element, followed by impinging on the common reflective mirror. In order to convert the light emitted from the amplifying medium to a P-polarized light with respect to the polarized beam splitter, the arrangement direction or orientation of the amplifying medium relative to the polarized beam splitter can be so adjusted as to produce a P-polarized light directly, or an optical member for rotating the polarizing plane, e.g., ½ wave plate, can be disposed between the amplifying medium and the polarized beam splitter to rotate the polarizing plane of the light emitted from the amplifying medium for producing a P-polarized light. The light reflected by the common reflective mirror enters the polarized beam splitter again after passing through the optical element. At this time, where the optical element is set up so that the P-polarized light having passed through the polarized beam splitter and having been reflected by the common reflective mirror is rotated by 90° in its polarizing plane by the optical element before entering the polarized beam splitter again, the P-Polarized light is converted to the S-polarized light relative to the polarized beam splitter for being thereby reflected toward the second reflective mirror. Alternatively, where the optical element is set up so that the P-polarized light having passed through the polarized beam splitter and having been reflected by the common reflective mirror is rotated by 45° in its polarizing plane by the optical element before entering the polarized beam splitter again, the P-Polarized light is converted to a light containing both the P-polarized light component and the S-polarized light component. Thus, the P-polarized light component passes through the polarized beam splitter toward the first reflective mirror, while the S-polarized light component is reflected thereby toward the second reflective mirror. It is not necessary to rotate the polarized light by 45°, but between 0° to 90°, in its polarizing plane so as to contain both the P-polarized light component and the S-polarized light component in the converted light.

Further, the second reflective mirror is disposed in an optical path extended in the reflecting direction of the S-polarized light such that the polarized beam splitter is interposed between the common reflective mirror and the second reflective mirror, thereby constituting another optical oscillator. Accordingly, when the light emitted from the amplifying medium disposed between the second reflective mirror and the polarized beam splitter is made incident on the polarized beam splitter as an S-polarized light, this S-polarized light is reflected by the polarized beam splitter and then passes through the optical element, followed by impinging on the common reflective mirror. In order to make the light emitted from the amplifying medium incident on the polarized beam splitter as an S-polarized light, the arrangement direction or orientation of the amplifying medium relative to the polarized beam splitter can be so adjusted as to produce an S-polarized light directly, or an optical member for rotating the polarizing plane, e.g., ½ wave plate, can be disposed between the amplifying medium and the polarized beam splitter to rotate the polarizing plane of the light emitted from the amplifying medium for producing an S-polarized light. The light reflected by the common reflective mirror enters the polarized beam splitter again after passing through the optical element. At this time, where the optical element is set up so that the S-polarized light having been reflected by the polarized beam splitter and then by the common reflective mirror is rotated by 90° in its polarizing plane by the optical element before entering the polarized beam splitter again, the S-Polarized light is converted to the P-polarized light relative to the polarized beam splitter for passing therethrough toward the first reflective mirror. Alternatively, where the optical element is set up so that the above S-polarized light is rotated by 45° in its polarizing plane by the optical element before entering the polarized beam splitter again, the S-polarized light is converted to a light containing both the P-polarized light component and the S-polarized light component. Thus, the P-polarized light component passes through the polarized beam splitter toward the first reflective mirror, while the S-polarized light component is reflected thereby toward the second reflective mirror.

Therefore, the P-polarized light is repeatedly reflected between the first reflective mirror and the common reflective mirror while being amplified through the amplifying medium disposed between the first reflective mirror and the polarized beam splitter. The S-polarized light is repeatedly reflected between the second reflective mirror and the common reflective mirror while being amplified through the amplifying medium disposed between the second reflective mirror and the polarized beam splitter. Here, the optical element functions to convert a portion or the whole of the P-polarized light to the S-polarized light and a portion or the whole of the S-polarized light to the P-polarized light during the repeated reflection cycles of the polarized laser beams. Accordingly, one optical oscillator comprising the first reflective mirror, the common reflective mirror and the amplifying medium disposed therebetween, and another optical oscillator comprising the second reflective mirror, the common reflective mirror and the amplifying medium disposed therebetween, jointly constitute a single united oscillator so that the P-polarized light and the S-polarized light are coherently synthesized together. As a result, the P-polarized light and the S-polarized light are unified into a high-energy laser beam in a single polarized state to be emitted to the outside after passing through common a reflective mirror.

In the second embodiment, semiconductor elements each having an active layer held between a pair of clad layers is employed as the amplifying media of the above first embodiment. These semiconductor elements each emit a laser beam which has the major axis directed perpendicular to the active layer and has an oval circular sectional shape. Therefore, the semiconductor elements are disposed in the optical paths of the laser beams between the first and second reflective mirrors and the optical path changing means, respectively, such that the oval circles of the laser beams are entirely superposed onto each other. For ensuring the arrangement that the oval circles of the laser beams are entirely superposed onto each other, it is simply needed to arrange the semiconductor elements in such a manner as to direct their active layers to hold the same angle with respect to a reference plane. For example, assuming that the reference plane is a horizontal plane, the semiconductor elements are arranged such that the active layers lie on the horizontal plane (i.e., the active layers hold an angle of 0 degrees with respect to the reference plane). In this case, the laser beams emitted from the respective semiconductor elements have their major axes in section lying vertically. Where the semiconductor elements are arranged in such orientation, the polarizing planes of the laser beams emitted from the respective semiconductor elements are also directed corresponding to that orientation. Accordingly, the polarizing plane of at least one of the laser beams is rotated to adjust the laser beams having their predetermined polarizing planes incident on the optical path changing means.

In a like manner as mentioned above, the laser beams emitted from the semiconductor elements are repeatedly reflected between the corresponding reflective mirrors and the common reflective mirror while being amplified by the semiconductor elements. As a consequence, the resultant laser beam is emitted from the common reflective mirror as a high-energy laser beam summed in a single polarized state.

Figure 2:
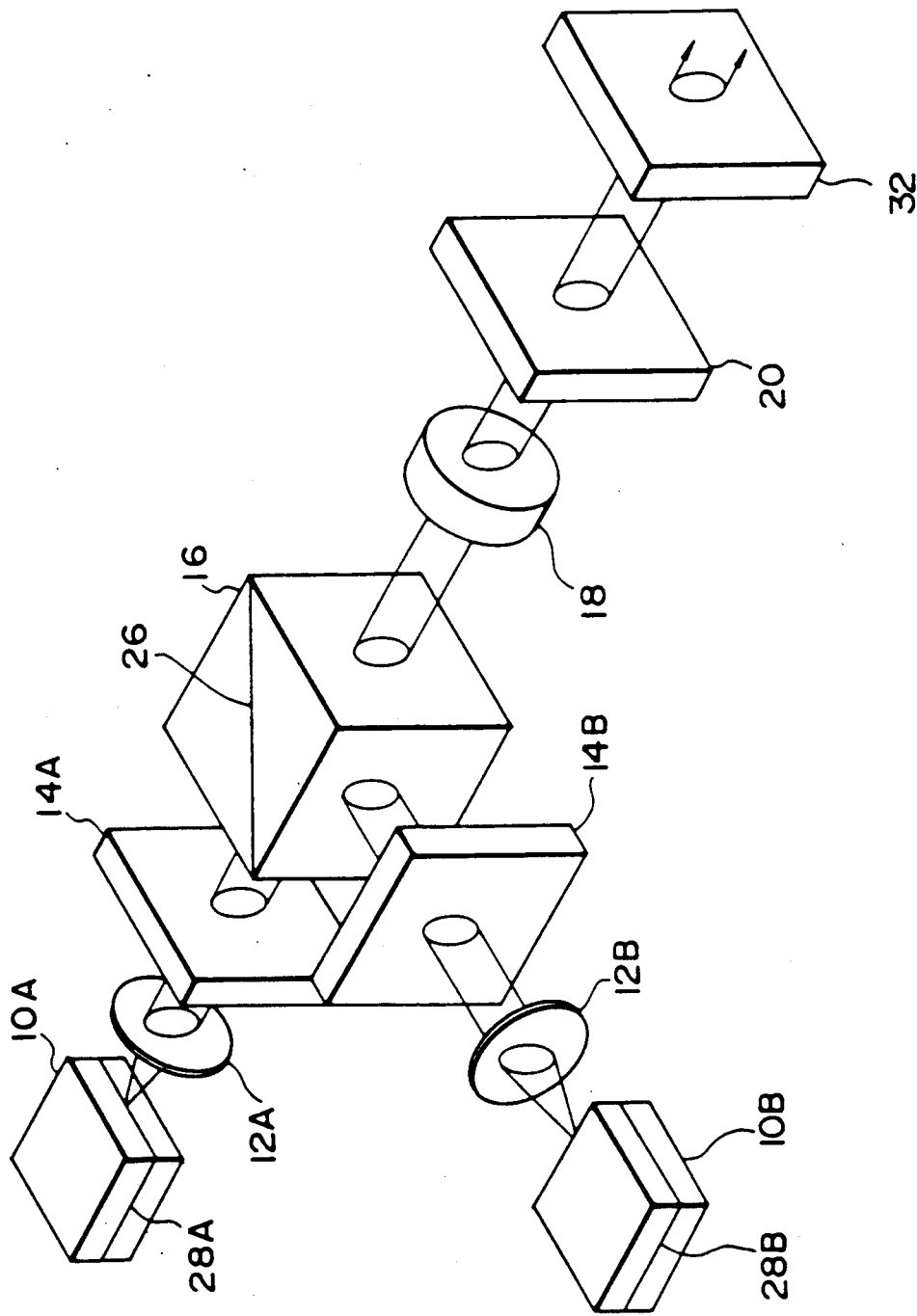
FIG. 2 is a diagrammatic perspective view of the practical embodiment of FIG. 1.
Figure 3:
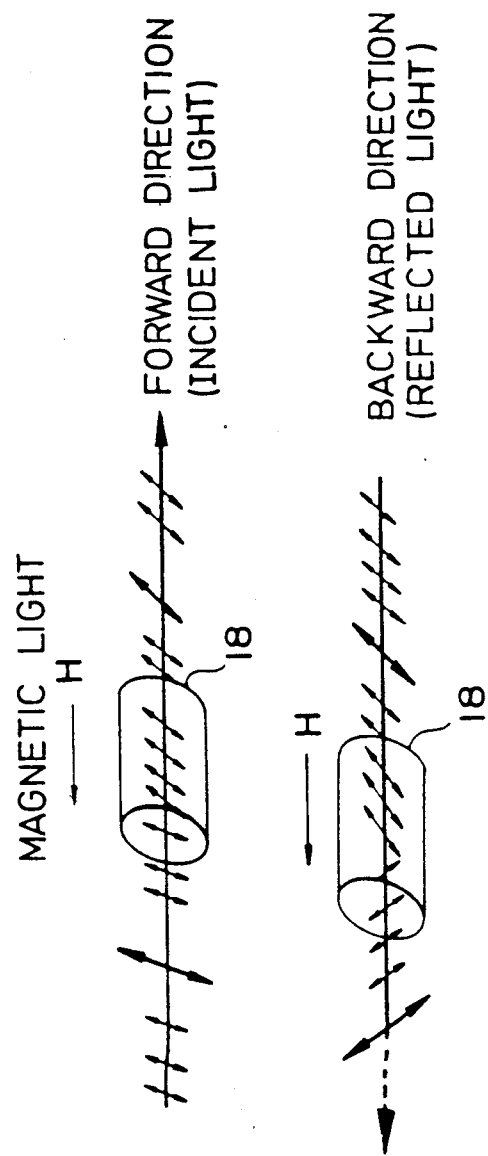
FIG. 3 is a schematic view for explaining changes in the polarizing plane produced through a Faraday cell.

By referring to the drawings, practical embodiments of the present invention will be explained below in detail. In these practical embodiments, a semiconductor laser is used as an amplifying medium and a polarized beam splitter is used as optical path changing means. As shown in FIGS. 1 and 2, a plane mirror 20 and a semiconductor laser 10A are disposed on the opposite sides of a polarized beam splitter 16. The element 20 is not limited to a plane mirror and may be a concave or convex mirror so long as it can constitute an oscillation system. The polarized beam splitter 16 comprises two 45°—and right-angled prisms 22, 24, and an alternately multi-layered film 26 consisting of a material with a high refractive index and a material with a low refractive index alternately vapor-deposited on an inclined surface of each prism, those two prisms 22, 24 being bonded to each other at their inclined surfaces. A reflective surface M3 of the plane mirror 20 on the side of the polarized beam splitter 16 is so coated as to exhibit reflectivity in a range of about 2-5%. A mirror surface M2 of the semiconductor laser 10A, as an example of the first amplifying medium, on the side of the polarized beam splitter 16, is so coated as to exhibit a non-reflective state. A mirror surface M1 of the semiconductor laser 10A on the side opposite to the mirror surface M2 is so coated as to exhibit reflectivity to about 90%. The semiconductor laser 10A is arranged such that its active layer 28A held between a pair of clad layers is directed horizontally. A collimator 12A is disposed between the semiconductor laser 10A and the polarized beam splitter 16, while a ½ wavelength plate 14A is disposed between the collimator 12A and the polarized beam splitter 16. The ½ wave plate 14A is arranged to have the direction of its optical axis previously adjusted such that after passing through the ½ wave plate 14A, the laser beam emitted from the semiconductor laser 10A becomes a P-polarized light, i.e., a linearly polarized light oscillating parallel to the incident plane of the polarized beam splitter 16 (i.e., in the sheet plane of FIG. 1). Note that the mirror surface M1 serves as a first reflective mirror and the reflective surface M3 serves as a common reflective mirror. A Faraday cell (or polarized plane rotator) 18 is disposed between the polarized beam splitter 16 and the plane mirror 20. As shown in FIG. 3, assuming that the length of an optically active substance in the Faraday cell is l, the intensity of the magnetic field is H, and the Verdet's constant is V, the total angle of rotation $\theta$ as developed for the linearly polarized light when reciprocally passing through the Faraday cell in the forward and backward directions, is expressed by the equation of $\theta = 2 \cdot VlH$. In view of that, this embodiment is so constituted as to develop the total angle of rotation $\theta$ equal to 45°. Thus, the Faraday cell 18 is set up such that the polarizing plane of the laser beam from the polarized beam splitter 16 is rotated by 45°/2 before outcoming therefrom toward the plane mirror 20, and the polarizing plane of the laser beam reflected by the plane mirror 20 is further rotated by 45°/2 before outcoming therefrom now toward the polarized beam splitter 16. Accordingly, the laser beam from the polarized beam splitter 16 is rotated in its polarizing plane by 45° by passing through the Faraday cell 18 in the forward direction and then passing through the Faraday cell 18 in the backward direction once again after being reflected by the plane mirror 20. In the reflecting direction of S-polarized light from the polarized beam splitter 16, there is disposed a semiconductor laser 10B which has an active layer 28B held between a pair of clad layers and directed horizontally. A mirror surface M2 of the semiconductor laser 10B, as an example of the second amplifying medium, on the side of the polarized beam splitter 16 is so coated as to exhibit a non-reflective state. A mirror surface M4 of the semiconductor laser 10B on the side opposite to the mirror surface M2 is so coated as to exhibit reflectivity of about 90%. A collimator 12B is disposed between the polarized beam splitter 16 and the semiconductor laser 10B, while a ¼ wave plate 14B is disposed between the collimator 12B and the polarized beam splitter 16. The ¼ wave plate 14B is arranged to have the direction of its optical axis previously adjusted such that the laser beam emitted from the semiconductor laser 10B is thereby rotated in its polarizing plane to become an S-polarized light, i.e., linearly polarized light oscillating perpendicular to the incident plane of the polarized beam splitter 16 (i.e., in the direction normal to the sheet plane of FIG. 1). The mirror surface M4 serves as a second reflective mirror. On the side of the plane mirror 20 from which the laser beam is taken out, there is disposed a wave plate 32 for compensating a phase difference between the two laser beams to be synthesized, thereby to provide a laser beam linearly polarized. Note that the wave plate 32 may be dispensed with in the absence of the phase difference.

Next, operation of the above practical example will be described below. When a voltage is applied across the pair of clad layers of each of the semiconductor lasers 10A, 10B, laser beams are emitted from both the lasers. The laser beam emitted from the semiconductor laser 10A becomes a P-polarized light after passing through the collimator 12A and the ¼ wave plate 14A, and then passes through the polarized beam splitter 16 and the Faraday cell 18 where its polarizing plane is rotated by 45°/2, before impinging upon the plane mirror 20 to be reflected by the reflective surface M3. The reflected laser beam once more passes through the Faraday cell 18 where its polarizing plane is rotated by 45°/2 again, followed by re-entering the polarized beam splitter 16 with the polarizing plane thereof rotated by 45° in total with respect to the polarizing plane of the above incoming P-polarized light. The polarized beam splitter 16 functions to pass the P-polarized light component of the re-entering laser beam therethrough and reflect the S-Polarized component thereof by the alternately multi-layered film 26. The above P-polarized light component passes through the ¼ wave plate 14A and the collimator 12A to get back incident on the semiconductor laser 10A. After being reflected by the mirror surface M1, the P-polarized light once again passes through the collimator 12A, the ¼ wave plate 14A, the polarized beam splitter 16 and the Faraday cell 18, followed by being reflected by the plane mirror 20.

Meanwhile, the S-polarized light component reflected by the polarized beam splitter 16 passes through the ¼ wave plate 14B and the collimator 12B to get back incident on the semiconductor laser 10B. After being reflected by the mirror surface M4, the S-polarized light once again passes through the collimator 12B, the ¼ wave plate 14B, and thereafter is reflected by the alternately multi-layered film 26 of the polarized beam splitter 16 for being directed to pass through the Faraday cell 18 and then reflected by the plane mirror 20. The laser beam thus reflected once more passes through the Faraday cell 18 to be rotated in its polarizing plane by 45° in total with respect to the polarizing plane of the above S-polarized light, followed by re-entering the polarized beam splitter 16. The polarized beam splitter 16 functions to pass the P-polarized light component of the re-entering laser beam therethrough and reflect the S-polarized component thereof by the alternately multi-layered film 26. In this manner, the P-polarized light is repeatedly reflected between the mirror surface M1 of the semiconductor laser 10A and the reflective surface M3 of the plane mirror 20 while being amplified through the active layer 28A of the semiconductor laser 10A. The S-polarized light is repeatedly reflected between the mirror surface M4 of the semiconductor laser 10B and the reflective surface M3 of the plane mirror 20 while being amplified through the active layer 28B of the semiconductor laser 10B. Here, the Faraday cell 18 allows such repeated reflections while converting the half component of the P-polarized light to the S-polarized light and reversely the half component of the S-polarized light to the P-polarized light in cooperation with the polarized beam splitter 16. Therefore, one optical oscillator comprising the mirror surface M1 of the semiconductor laser 10A, the reflective surface M3 of the plane mirror 20 and the active layer 28A of the semiconductor laser 10A, and another optical oscillator comprising the mirror surface M4 of the semiconductor laser 10B, the reflective surface M3 of the plane mirror 20 and the active layer 28B of the semiconductor laser 10B jointly constitute a single united oscillator so that the P-polarized light and the S-polarized light are coherently summed together. When the summed laser beam reaches a predetermined level of intensity, it passes through the plane mirror 20 for being emitted to the outside in a single polarized state. In this case, since the respective semiconductor lasers have the active layers lying horizontally, the laser beams are summed such that their major axes in sections are directed vertically and their oval circles are superimposed one above the other, as seen in FIG. 2. If there present a phase difference between the laser beams to be summed, the wave plate 32 compensates the phase difference to prevent the summed laser beam from being elliptically polarized.

Figure 4:
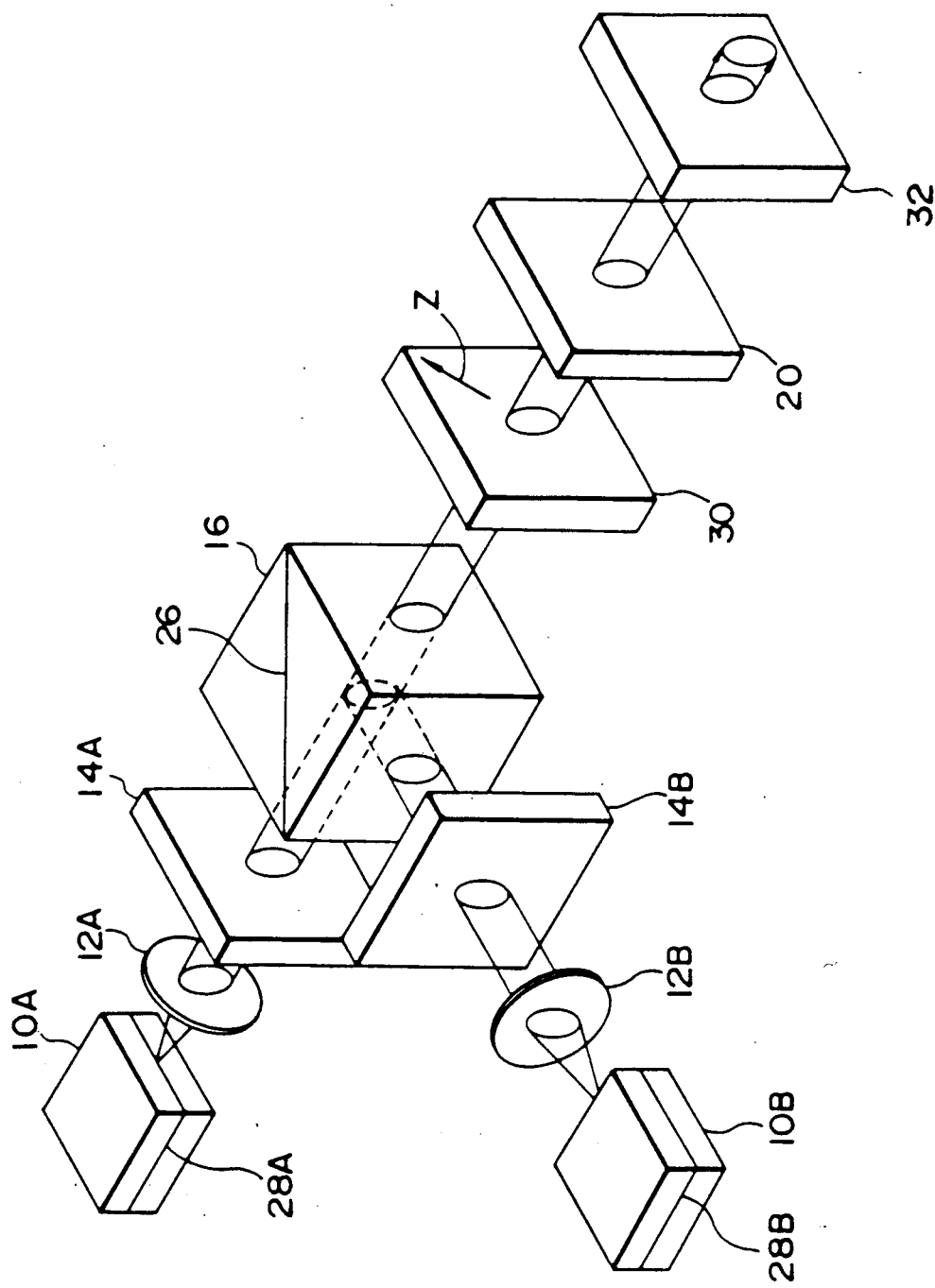
FIG. 4 is a diagrammatic perspective view of another practical embodiment of the present invention utilizing a ¼ wavelength plate.

The foregoing embodiment has been explained as using the Faraday cell 18 as the optical element, and equally dividing the laser beams reflected by the plane mirror 20 to the P-polarized light and the S-polarized light by the polarized beam splitter 16, so that both the polarized lights are concurrently amplified by the semiconductor lasers 10A, 10B through the process of stimulated emission. However, a ¼ wave plate may be disposed as the optical element in place of the Faraday cell 18. FIG. 4 shows another practical embodiment of the present invention in which a ¼ wave plate 30 is disposed between the polarized beam splitter 16 and the plane mirror 20. The ¼ wave plate 30 has its optical axis Z arranged to form an angle of 45° with respect to the polarizing plane of the P-polarized light (or S-polarized light). In other words, the optical axis Z forms an angle of 45° with respect to the horizontal plane. The same components in FIG. 4 as those in FIG. 2 are denoted by the same reference numerals and their explanation is omitted here. Since the optical axis Z of the ¼ wave plate 30 forms an angle of 45° with respect to the polarizing plane of the P-polarized light, the P-polarized light having passed through the ¼ wave plate 30 is converted to right-hand circularly polarized light that is then converted to left-hand circularly polarized light upon reflection by the plane mirror 20, followed by being further converted to S-polarized light while reversely passing through the ¼ wave plate 30 again. On the other hand, since the optical axis Z of the ¼ wave plate 30 forms an angle of 45° with respect to the polarizing plane of the S-polarized light in opposite relation to that of the P-polarized light, the S-polarized light having passed through the ¼ wave plate 30 is converted to left-hand circularly polarized light that is then converted to right-hand circularly polarized light upon reflection by the plane mirror 20, followed by being further converted to P-polarized light while reversely passing through the ¼ wave plate 30 again. Thus, the P-polarized light is converted to S-polarized light and the S-polarized light is converted to P-polarized light through a combination of the ¼ wave plate 30 and the plane mirror 20. Accordingly, the laser beam emitted from the semiconductor laser 10A passes through the collimator 12A, the ½ wave plate 14A, the polarized beam splitter 16 and the ¼ wavelength cell 30 for being then reflected by the plane mirror 20. After backwardly passing through the ¼ wave plate 30, that laser beam is reflected by the alternately multi-layered film 26 of the polarized beam splitter 16 and then passes through the ½ wave plate 14B and the collimator 12B, followed by coming into the semiconductor laser 10B. On the contrary, the laser beam emitted from the semiconductor laser 10B comes into the semiconductor laser 10A. In this manner, the whole of the laser beam emitted from the semiconductor laser 10A is led to be incident on the semiconductor laser 10B and the whole of the laser beam emitted from the semiconductor laser 10B is led to be incident on the semiconductor laser 10A, as a result of repetition of which process the laser beams are amplified. Incidentally, a Faraday cell may be used in place of the ¼ wave plate to rotate the polarizing plane of each laser beam by 90°, such that the whole of the laser beam emitted from the semiconductor laser 10A is led to be incident on the semiconductor laser 10B and vice versa.

Figure 5:
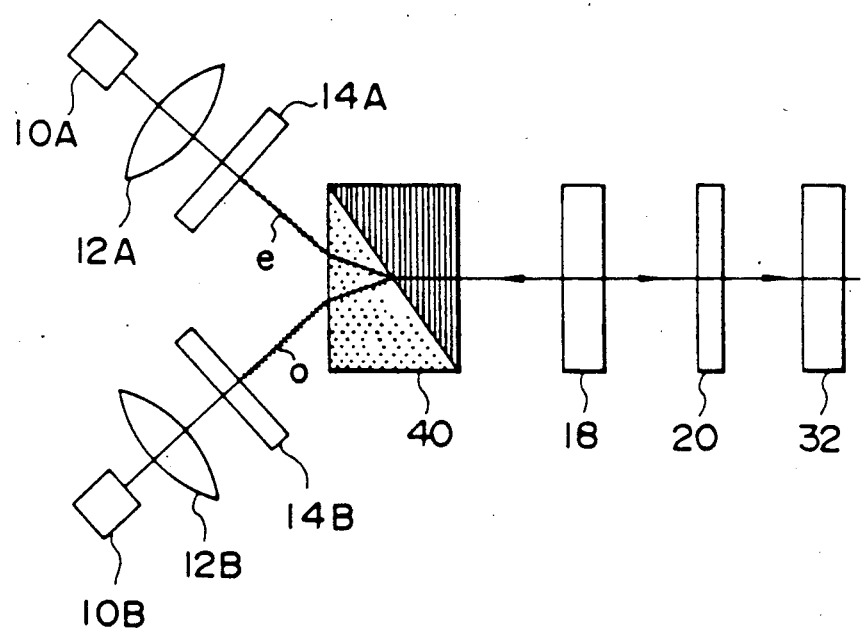
FIG. 5 is a diagrammatic plan view of still another practical embodiment of the present invention utilizing a Wollaston prism.

Although the foregoing practical embodiments have been explained as employing the polarized beam splitter 16 as the optical path changing means, a polarizing prism may be used instead. FIG. 5 shows still another practical embodiment of the present invention in which a Wollaston prism 40 is used as a polarizing prism. The Wollaston prism 40 serves to separate the laser beam reflected by the plane mirror 20 into an ordinary ray o and an extraordinary ray e. Thus, the Wollaston prism functions in a like manner to the polarized beam splitter 16 as mentioned above. Note that the components in FIG. 5 corresponding to those in FIG. 1 are denoted by the same reference numerals and their explanation is omitted here. Incidentally, a Senermont prism, a Rochon prism or a Glan-Thompson prism may be used other than the Wollaston prism.

Further, the foregoing embodiments have been explained as using one of the side surfaces of the semiconductor lasers as the first and second reflective mirrors, respectively. But, it is also possible to coat those two reflective mirror surfaces of the semiconductor lasers into a non-reflective state, and provide the first and second reflective mirrors separately from the semiconductor lasers. Moreover, the two ½ wave plates are used in the foregoing embodiments. Alternatively, however, one semiconductor laser may be so arranged as to emit a laser beam having its polarizing plane coincident with that of the P-polarized light or the S-polarized light, while a laser beam emitted from the other semiconductor laser may be rotated in its polarizing plane by a ½ wave plate to become the S-polarized light or the P-polarized light. In this case, only one ½ wave plate is required and hence the cost is reduced. In addition, although the foregoing embodiments have been explained as arranging the active layers of the semiconductor lasers to be directed horizontally, the semiconductor lasers may be arranged in any desired direction so long as their active layers hold the same angle with respect to the reference plane. Further, although the semiconductor lasers are employed as the modifying mediums in the foregoing embodiments, any other mediums for stimulated emission utilized in gas lasers, solid layers and the like may be used instead. The present invention is also applicable to light sources for optical disk players, thermal printers, laser printers and the like.

What is claimed is:

1. A light amplifying device, comprising:
   an optical resonator constituted by first and second reflective mirrors and a common reflective mirror, disposed in optically opposite relation to each other, said common reflective mirror having reflectivity smaller than reflectivities of said first and second reflective mirrors;
   optical path changing means comprising one of a polarized beam splitter and a polarizing prism disposed between said first and second reflective mirrors and said common mirror for making the laser beams incoming from a side of said common reflective mirror emerge in a direction toward at least one of said first and second reflective mirrors corresponding to either direction of an orthogonal polarizing plane, and for making laser beams incoming from the sides of said first and second reflective mirrors incident on said common mirror;
   first and second amplifying media disposed in optical paths of the laser beams between said first and second reflective mirrors and said optical path changing means, respectively, for amplifying the laser beams through the process of stimulated emission; and
   an optical element, disposed between said common reflective mirror and said optical path changing means, for rotating the polarizing plane of the laser beam transmitted to said optical element both after outcoming from said optical path changing means and after being reflected by said common reflective mirror, by a predetermined angle with respect to the polarizing plane of the laser beam coming into the optical element after coming out of said optical path changing means, so as to cause at least a part of the laser beam coming out of one of said amplifying media to enter the other of said amplifying media; whereby laser beams emitted from said amplifying media are summed coherently to provide a high-energy laser beam in a single polarized state.

2. A light amplifying device according to claim 1, wherein the predetermined angle rotated by said optical element is set to such a value as to allow said optical path changing means to make the substantially whole of the laser beam coming in from either one of said first and second reflective mirrors incident on said common reflective mirror, incident on the other of said first and second reflective mirrors from which said either one of said laser beams originated, thus the laser beam originating from said first amplifying media is reflected towards said second reflective mirror and the laser beam originating in said second amplifying media is reflected toward said first reflective mirror.

3. A light amplifying device according to claim 1, wherein the predetermined angle rotated by said optical element is set to such a value as to allow said optical path changing means to divide the substantially whole of either one of laser beams, after passing through said optical element both before and then after being reflected by said common reflective mirror, into separate components to be incident on said first and second reflective mirrors, respectively.

4. A light amplifying device according to claim 1, wherein said optical element comprises a Faraday cell for rotating the polarizing planes of the laser beams by a predetermined angle such that the laser beams reflected by said common reflective mirror and having the polarizing planes orthogonal to each other are converted to those laser beams which have the polarizing planes respectively perpendicular to the polarizing planes as developed when outcoming from said optical path changing means.

5. A light amplifying device according to claim 1, wherein said optical element comprises a ¼ wave plate for converting a linearly polarized light to a circularly polarized light rotating in a certain direction, and a circularly polarized light rotating in a direction opposite to said certain direction to a linearly polarized light which has the polarizing plane perpendicular to that of said linearly polarized plane.

6. A light amplifying device according to claim 1, wherein said optical path changing means comprises a polarized beam splitter constituted by two 45°—and right-angled prisms, and an alternately multi-layered film consisting of a material with a high refractive index and a material with a low refractive index alternately vapor-deposited on an inclined surface of each of said prisms, said prisms being bonded to each other at their inclined surfaces, so that said polarized beam splitter has an inclined surface able to pass therethrough one of the laser beams having the polarizing planes orthogonal to each other, and reflect the other of the laser beams, said laser beams entering said polarized beam splitter after being reflected by said common reflective mirror and then having passed through said optical element.

7. A light amplifying device, comprising:
a polarized beam splitter allowing a P-polarized light oscillating in parallel to the incident plane to pass through said polarized beam splitter, and reflecting an S-polarized light oscillating perpendicular to the incident plane in a direction different from the passing direction of the P-polarized light;
an optical resonator constituted by a first reflective mirror and a common reflective mirror having reflectivity smaller than that of said first reflective mirror, both of which are disposed in an optical path extended in said passing direction of the P-polarized light in opposite relation to each other with said polarized beam splitter therebetween;
a second reflective mirror having reflectivity equivalent to that of said first reflective mirror, and disposed in an optical path extended in said reflecting direction of the S-polarized light such that said polarized beam splitter is interposed between said common reflective mirror and said second reflective mirror, thereby constituting another optical oscillator in cooperation with said common reflective mirror;
amplifying media disposed between said first reflective mirror and said polarized beam splitter and said second reflective mirror and said polarized beam splitter, respectively, for amplifying the lights through the process of stimulated emission; and
an optical element disposed between said common reflective mirror and said polarized beam splitter for rotating the polarizing plane of the laser beam transmitted to said optical element both after outcoming from said optical path changing means and after being reflected by said common reflective mirror, by a predetermined angle with respect to the polarizing plane of the laser beam coming into the optical element after coming out of said optical path changing means, so as to cause at least a part of the laser beam coming out of one of said amplifying media to enter the other of said amplifying media; whereby the laser beam emitted from said amplifying media are summed coherently to provide a laser beam of high energy.

8. A light amplifying device according to claim 7, wherein said optical element comprises a Faraday cell for rotating the polarizing planes of laser beams which constitute said light by a predetermined angle such that the laser beams reflected by said common reflective mirror and having the polarizing planes orthogonal to each other are converted to those laser beams which have the polarizing planes respectively perpendicular to the polarizing planes as developed when outcoming from said polarized beam splitter.

9. A light amplifying device according to claim 7, wherein said optical element comprises a ¼ wave plate for converting a linearly polarized light to a circularly polarized light rotating in a certain direction, and a circularly polarized light rotating in a direction opposite to said certain direction to a linearly polarized light which has the polarizing plane perpendicular to that of said linearly polarized plane.

10. A light amplifying device according to claim 7, wherein said optical element comprises a Faraday cell for rotating the polarizing planes of laser beams which constitute said light by a predetermined angle such that the P-polarized laser beam reflected by said common reflective mirror has the polarizing plane rotated to oscillate in a direction between the incident plane and the plane perpendicular to the incident plane, when entering said optical path changing means.

11. A light amplifying device according to claim 7, wherein said optical path changing means comprises a polarized beam splitter constituted by two 45°—right-angled prisms, and an alternately multi-layered film consisted of a material with a high refractive index and a material with a low refractive index alternately vapor-deposited on an inclined surface of each of said prisms, said prisms being bonded to each other at their inclined surfaces, whereby said polarized beam splitter receives said P-polarized laser beam reflected by said common reflective mirror and having the polarizing plane rotated to oscillate in a direction between the incident plane and the plane perpendicular to the incident plane, for passing therethrough the P-polarized light component toward said first reflective mirror and reflecting the S-polarized light component toward said second reflective mirror.

12. A light amplifying device according to claim 7, further comprising:
collimators disposed between said amplifying media and said polarized beam splitter.

13. A light amplifying device, comprising:

a polarized beam splitter allowing a P-polarized light oscillating in parallel to the incident plane to pass through said polarized beam splitter, and reflecting an S-polarized light oscillating perpendicular to the incident plane in a direction different from the passing direction of the P-polarized light;

an optical oscillator constituted by a first reflective mirror and a common reflective mirror having reflectivity smaller than that of the first reflective mirror, both of which are disposed in an optical path extended in said passing direction of the P-polarized light in opposite relation to each other with said polarized beam splitter therebetween;

a second reflective mirror having reflectivity equivalent to that of said first reflective mirror, and disposed in an optical path extended in said reflecting direction of the S-polarized light such that said polarized beam splitter is interposed between said common reflective mirror and said second reflective mirror, thereby constituting another optical oscillator in cooperation with said common reflective mirror;

semiconductor elements each having an active layer held between a pair of clad layers to emit a laser beam which has the major axis directed perpendicular to the active layer and has an oval cross sectional shape, said semiconductor elements being disposed between said first reflective mirror and said polarized beam splitter and between said second reflective mirror and said polarized beam splitter, respectively, such that the oval cross sections of the laser beams are entirely superposed onto each other;

polarizing plane adjuster means for rotating the polarizing plane of at least one of the laser beams emitted from said semiconductor elements to be adjusted such that the laser beams enter the polarized beam splitter as P- and S-polarized lights, respectively; and an optical element disposed between said common reflective mirror and said polarized beam splitter for rotating the polarizing plane of the laser beam transmitted to said optical element both after outcoming from said optical path changing means and after being reflected by said common reflective mirror, by a predetermined angle with respect to the polarizing plane of the laser beam coming into the optical element after coming out of said optical path changing means, so as to cause at least a part of the laser beam coming out of one of said amplifying media to enter the other of said amplifying media; whereby the laser beam emitted from said amplifying media are summed coherently to provide a laser beam of high energy.

14. A light amplifying device according to claim 13, wherein said optical element comprises a Faraday cell for rotating the polarizing planes of the laser beams by a predetermined angle such that the laser beams reflected by said common reflective mirror and having the polarizing planes orthogonal to each other are converted to those laser beams which have the polarizing planes respectively perpendicular to the polarizing planes as developed when outcoming from said polarized beam splitter.

15. A light amplifying device according to claim 13, wherein said optical element comprises a ¼ wave plate for converting a linearly polarized light to a circularly polarized light rotating in a certain direction, and a circularly polarized light rotating in a direction opposite to said certain direction to a linearly polarized light which has the polarizing plane perpendicular to that of said linearly polarized plane.

16. A light amplifying device according to claim 13, further comprising:
collimators disposed between said amplifying media and said polarized beam splitter.

17. A light amplifying device according to claim 13, wherein said polarizing plane adjuster means comprises at least one ½ wave plate disposed between said polarized beam splitter and said collimator for rotating the polarizing plane of at least one of the laser beams emitted from said semiconductor elements to be adjusted such that said laser beams are incident on said polarized beam splitter as laser beams having the polarizing planes orthogonal to each other, respectively.

18. A light amplifying device according to claim 13, wherein said polarizing plane adjuster means comprises one of said semiconductor elements arranged such that a first laser beam emitted from said one semiconductor element is coincident with either one of laser beams having the polarizing planes orthogonal to each other, and a ½ wave plate disposed between said polarized beam splitter and said collimator for rotating the polarizing plane of a second laser beam emitted from the other of said semiconductor elements to be adjusted such that said second laser beam is incident on said polarized beam splitter as the other of said laser beams having the polarizing planes orthogonal to each other.

19. A light amplifying device, comprising:
an optical resonator constituted by first and second reflective mirrors and a common reflective mirror, disposed in optically opposite relation to each other, said common reflective mirror having reflectivity smaller than reflectivities of said first and second reflective mirrors;

optical path changing means disposed between said first and second reflective mirrors and said common mirror for making the laser beams incoming from a side of said common reflective mirror emerge in a direction toward at least one of said first and second reflective mirrors corresponding to either direction of an orthogonal polarizing plane, and for making laser beams incoming from the sides of said first and second reflective mirrors incident on said common mirror;

first and second amplifying media disposed in optical paths of the laser beams between said first and second reflective mirrors and said optical path changing means, respectively, for amplifying the laser beams through the process of stimulated emission; and an optical element, disposed between said common reflective mirror and said optical path changing means, for rotating the polarizing plane of the laser beam transmitted to said optical element both after outcoming from said optical path changing means and after being reflected by said common reflective mirror, by a predetermined angle with respect to the polarizing plane of the laser beam coming into the optical element after coming out of said optical path changing means, so as to cause at least a part of the laser beam coming out of one of said amplifying media to enter the other of said amplifying media; whereby laser beams emitted from said amplifying media are summed coherently to provide a high-energy laser beam in a single polarized state.

* * * * *